(12) United States Patent
Natarajan et al.

(10) Patent No.: US 6,347,043 B1
(45) Date of Patent: Feb. 12, 2002

(54) POWER SUPPLY INCLUDING CIRCUIT BOARD WITH A CONDUCTIVE BRACKET FOR ELECTRICAL GROUND

(75) Inventors: Thiagarajan Natarajan, Fremont, CA (US); Peter Heffernan, Southampton; Alan Beck, Crestwick, both of (GB)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/551,926

(22) Filed: Apr. 19, 2000

(51) Int. Cl.[7] .............................. H05K 7/00; H05K 9/00
(52) U.S. Cl. ...................... 361/799; 361/753; 361/801; 361/825; 312/223.1; 206/719; 174/51
(58) Field of Search ................................ 361/753, 796, 361/799, 801, 803, 825; 174/51; 439/92; 206/706, 719; 312/223.1, 223.2

(56) References Cited

U.S. PATENT DOCUMENTS

| | | | | |
|---|---|---|---|---|
| 5,192,216 A | * | 3/1993 | Knauber et al. | 439/108 |
| 5,515,021 A | * | 5/1996 | Rynkiewicz | 336/65 |
| 5,608,611 A | * | 3/1997 | Szudarek et al. | 361/753 |
| 5,816,673 A | | 10/1998 | Sauer et al. | |
| 6,121,765 A | | 9/2000 | Carlson | |

* cited by examiner

Primary Examiner—Jayprakash N. Gandhi
(74) Attorney, Agent, or Firm—Conley, Rose & Tayon, PC; B. Noël Kivlin

(57) ABSTRACT

A system (e.g., a power supply) is presented which allows a user to electrically couple a common ground electrical potential of a circuit (e.g., a power supply circuit return) to, or electrically isolate the common ground electrical potential from, an earth grounded chassis, without having to open the chassis. The system may include a metal bolt and nut, wherein the nut is coupled to an electrically conductive bracket. The bracket is mounted upon a printed circuit board and electrically coupled to the common ground electrical potential. When an insulating bushing is installed in a hole in the chassis adjacent to the bracket, and a threaded shaft of the bolt extends through aligned holes in the insulating bushing, an insulating member positioned between the bracket and the chassis, and the bracket, and the threaded shaft engages the nut, the bolt holds the insulating bushing in place, and the bracket is electrically isolated from the chassis. When the insulating bushing is replaced with a conductive washer, the bolt and the conductive washer form a conductive electrical path between the bracket and the chassis. Components of the described system may be employed in systems having multiple cabinets (or complex cabinet systems) to achieve a single point of grounding. System components may also be employed to selectively isolate or couple a power supply return to a chassis ground in devices other than power supplies.

19 Claims, 4 Drawing Sheets

POWER SUPPLY INCLUDING CIRCUIT BOARD WITH A CONDUCTIVE BRACKET FOR ELECTRICAL GROUND

BACKGROUND OF THE INVENTION

1. Field of the Invention

This invention relates to power supplies and system grounding, and more particularly to power supplies and systems having electrically conductive chassis electrically coupled to an earth ground electrical potential.

2. Description of the Related Art

Most electronic devices require direct current (DC) electrical power. Portable electronic devices typically dissipate relatively small amounts of electrical power during use, and are typically powered by a battery producing DC electrical power. Electronic devices designed for stationary indoor operation typically include a power supply which converts alternating current (AC) power, e.g. from an electrical outlet in a wall, to DC power.

FIG. 1 is a diagram of a typical power supply 10 including a power supply circuit 12 producing a DC voltage between a DC voltage (DCV) terminal 14 and a return terminal 16. Power supply circuit 12 may be a portion of a linear power supply circuit or a switching power supply circuit. Power supply circuit 12 includes a transformer 18, a rectifier 20, and a filter 22. Transformer 18 produces an AC voltage between opposed first and second ends of a secondary winding 24. A first end of secondary winding 24 is connected to rectifier 20, and a second end of secondary winding 24 is connected to return terminal 16. The second end of secondary winding 24 forms a common ground electrical potential for components of circuit 12 as indicated by symbol 26. Rectifier 20 rectifies the AC voltage produced by transformer 18, producing a time-varying DC voltage. Filter 22 receives the time-varying DC voltage produced by rectifier 20 and smoothes the time-varying DC voltage, producing a substantially constant DC voltage at an output terminal. The output terminal of filter 22 is connected to DCV terminal 14. Where power supply circuit 12 is a switching circuit, an output voltage feedback signal may be conducted from the output terminal of filter 22 to a switching circuit driving a primary winding of transformer 18 as indicated in FIG. 1.

Power supply circuit 12 is housed within an electrically conductive metal enclosure or chassis 18. Metal chassis 18 is typically connected to an earth ground electrical potential for safety reasons as indicated by symbol 28. Metal chassis 18 completely surrounds power supply circuit 12, thus preventing a user from contacting high voltages present within power supply circuit 12 during operation. Where power supply circuit 12 is a switching circuit, grounded metal chassis 18 also provides a measure of shielding which reduces an amount of electromagnetic radiation produced by the switching circuit during operation and received by other electronic circuits located near power supply 10.

As is typical, the common ground of power supply circuit 12 is electrically connected to chassis 18 within chassis 18. In FIG. 1, this electrical connection is represented by conductor 30. Conductor 30 presents a problem in that conductor 30 provides a path for noise voltages to be conducted between the common ground potential of power supply circuit 12 and chassis 18. For example, a system including power supply 10 also includes other electronic devices having different connections to earth ground. Where the connections to earth ground of two or more of the devices are physically separated from one another, the earth ground potentials may be different, causing "ground loop" currents to flow between the differing potentials. Noise voltages are created when ground loop currents flow through conductor resistances. In FIG. 1, any noise voltage present upon chassis 18 is conducted into the common ground potential of power supply circuit 12 by conductor 30, and into any electronic device receiving DC electrical power from power supply 10. It is also true that any noise voltage coupled into the common ground potential of power supply circuit 12 (e.g., by an electronic device receiving DC electrical power from power supply 10) is coupled into chassis 18 by conductor 30, and into any other device coupled to chassis 18.

It would thus be desirable to have a power supply which provides electrical isolation between a common ground electrical potential and a metallic chassis. Such isolation would eliminate the noise voltage conduction path present between the common ground potential and the metallic chassis of typical power supplies.

SUMMARY OF THE INVENTION

A system (e.g., a power supply) is presented which allows a user to electrically couple a common ground electrical potential of a circuit (e.g., a common power supply return) to an earth grounded chassis, or to electrically isolate the common ground electrical potential from the earth grounded chassis, without having to open the chassis. The circuit is formed upon a printed circuit board (PCB). The system includes an electrically conductive fastener having a threaded shaft (e.g., a metal bolt), and an electrically conductive bracket (e.g., a metal "L" bracket). The bracket is mounted upon the PCB and electrically coupled to the common ground electrical potential. The bracket is adapted for receiving the threaded shaft of the fastener.

The system includes an electrically insulating bushing having a washer-like first portion and a sleeve-like second portion. A hole in the isolating bushing passes through both the washer-like first portion and the sleeve-like second portion, and is dimensioned to pass the threaded shaft of the fastener. An outer diameter of the washer-like first portion is greater than an outer diameter of the sleeve-like second portion.

The electrically conductive chassis houses the PCB, and is adapted for coupling to an earth ground potential (e.g., for safety reasons). A portion of the chassis is adjacent to the bracket, and has a hole dimensioned to receive the sleeve-like second portion of the insulating bushing. The hole in the portion of the chassis adjacent to the bracket may, for example, have a diameter greater than or equal to the outer diameter of the sleeve-like second portion of the insulating bushing, and less than the outer diameter of the washer-like first portion of the insulating bushing.

In one embodiment, the fastener is a metal bolt. The bracket has a hole dimensioned to pass the threaded shaft of the bolt, and an electrically conductive nut is mechanically and electrically coupled to the bracket. The nut has a hole therethrough and a threaded inner surface for receiving the threaded shaft of the bolt.

The system may include an electrically insulating member disposed between, and in physical contact with, the bracket and the portion of the chassis adjacent to the bracket. The insulating member may have a hole dimensioned to pass the threaded shaft of the bolt.

In order to electrically isolate the common ground electrical potential of the circuit from the earth grounded chassis, the user may insert the sleeve-like second portion of the insulating bushing into the hole in the portion of the chassis adjacent to the bracket. The user may push the threaded shaft of the bolt through the hole in the insulating bushing, the hole in the insulating member, and the hole in the bracket. The user may turn the bolt to engage the threaded shaft of the bolt and the threaded inner surface of the nut, thereby tightening the bolt. When adequately tightened, the bolt holds the insulating bushing in place. The bracket is electrically isolated from the chassis, and the common ground electrical potential is electrically isolated from the earth ground potential.

The system may also include an electrically conductive washer having a hole dimensioned to pass the threaded shaft of the bolt. In order to electrically couple the common ground electrical potential of the circuit to the earth grounded chassis, the user may align the hole in the conductive washer with the hole in the portion of the chassis adjacent to the bracket, and push the threaded shaft of the bolt through the hole in the conductive washer, the hole in the portion of the chassis adjacent to the bracket, the hole the insulating bushing, the hole in the insulating member, and the hole in the bracket. The user may turn the bolt to engage the threaded shaft of the bolt and the threaded inner surface of the nut, thereby tightening the bolt. When adequately tightened, the bolt holds the conductive washer in place between a shoulder portion of the bolt and an outer surface of the chassis. The bolt and the conductive washer form a conductive electrical path between the bracket and the earth grounded chassis, and the common ground electrical potential is electrically coupled to the earth ground potential.

The insulating bushing and the insulating member may be formed from an electrically insulating plastic material. The insulating member, and the insulating bushing when installed as described above, preferably has a dielectric strength sufficient to withstand an electrical potential of about 3,750 volts applied between the bracket and the chassis for a time period of approximately 60 seconds. The insulating member, and the insulating bushing when installed as described above, is preferably made from a material which can withstand a temperature of 100° C. over a significant portion of an expected lifetime of the material.

The above described system components may be advantageously employed in systems having multiple cabinets (or complex cabinet systems) to allow a user to achieve a single point of grounding, if necessary. Further, the above described system features may also be employed to selectively isolate or couple a power supply return to a chassis ground in devices other than power supplies.

BRIEF DESCRIPTION OF THE DRAWINGS

Other objects and advantages of the invention will become apparent upon reading the following detailed description and upon reference to the accompanying drawings in which.

Figure 1:
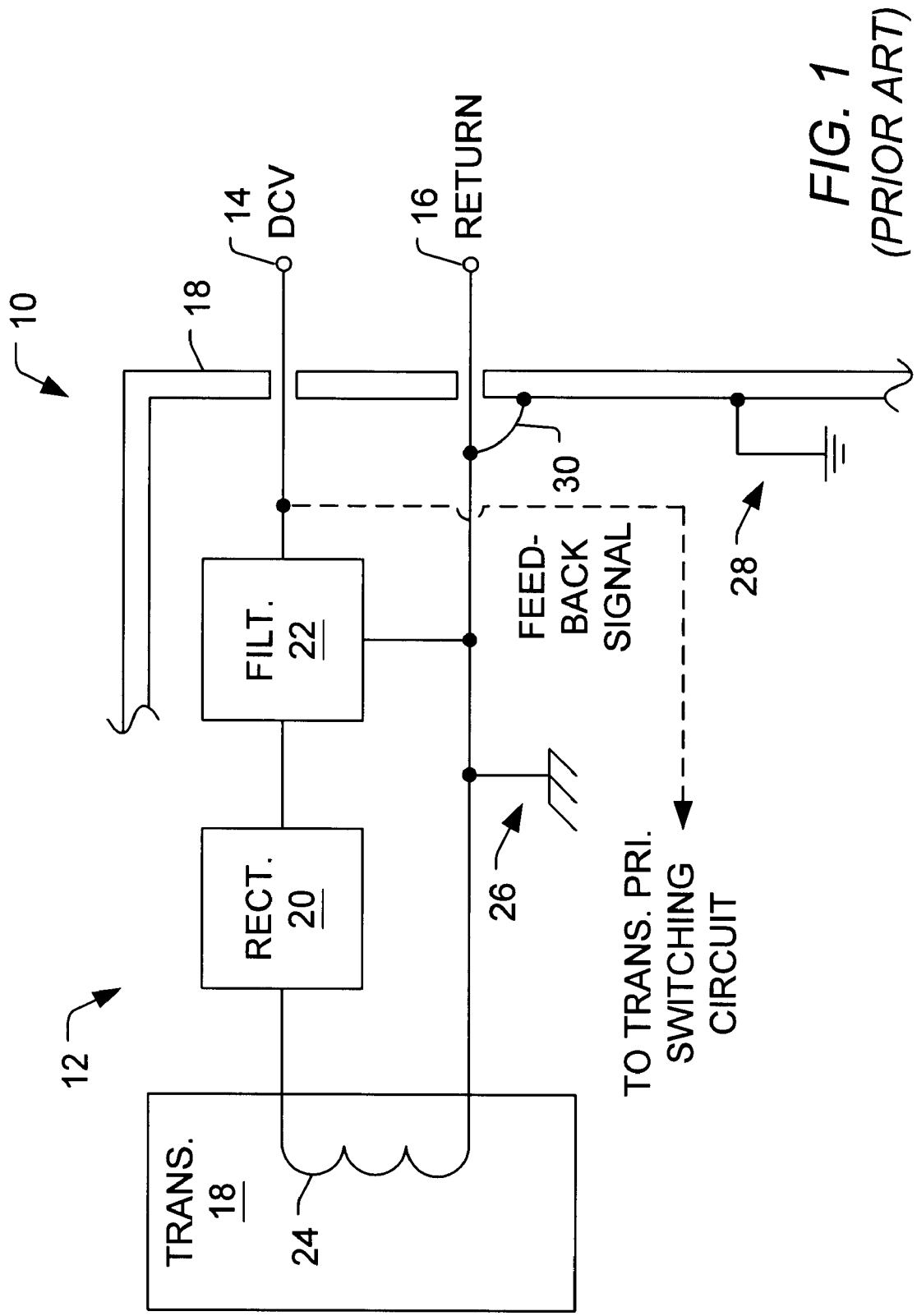
FIG. 1 is a diagram of a typical power supply including a power supply circuit producing a direct current (DC) voltage.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
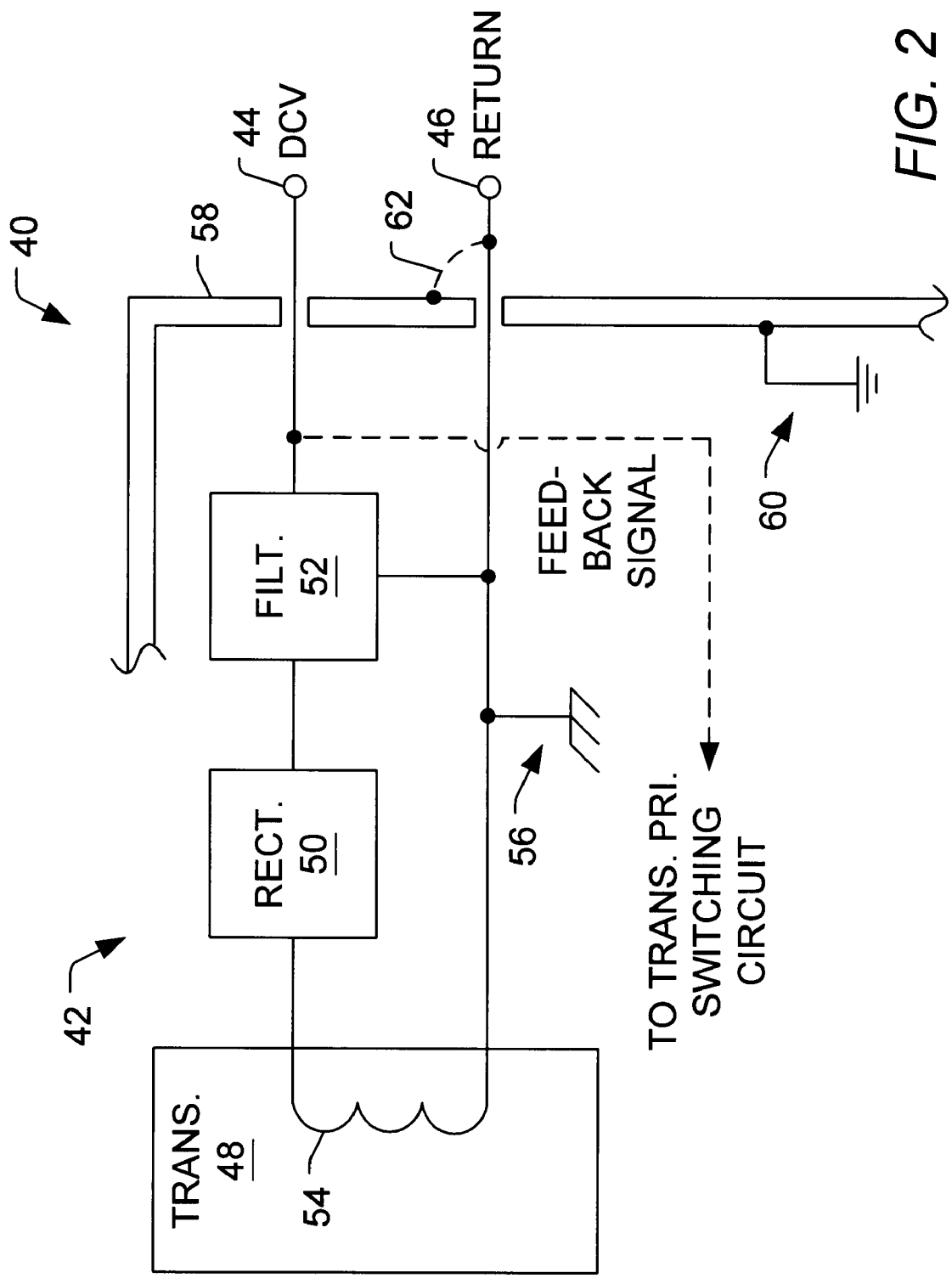
FIG. 2 is a diagram of one embodiment of a power supply including a power supply circuit producing a DC voltage and housed within an electrically conductive chassis coupled to an earth ground electrical potential.

FIG. 2 is a diagram of one embodiment of a power supply 40 including a power supply circuit 42 producing a DC electrical voltage between a DC voltage (DCV) terminal 44 and a return terminal 46. Power supply circuit 42 may be a portion of a linear power supply circuit or a switching power supply circuit. Power supply circuit 42 includes a transformer 48, a rectifier 50, and a filter 52. Transformer 48 produces an AC voltage between opposed first and second ends of a secondary winding 54. A first end of secondary winding 54 is coupled to rectifier 50, and a second end of secondary winding 54 is connected to return terminal 46. The second end of secondary winding 54 is connected to a reference electrical potential or common ground for components of circuit 42 as indicated by symbol 56. It is noted that other power supply returns may be connected to the common ground electrical potential indicated by symbol 56. Rectifier 50 rectifies the AC voltage produced by transformer 48, producing a time-varying DC voltage. Rectifier 50 may include, for example, one or more semiconductor diodes. Filter 52 receives the time-varying DC voltage produced by rectifier 50 and smoothes the time-varying DC voltage, producing a substantially constant DC voltage at an output terminal. Filter 52 may include a capacitor, an inductor, and/or a voltage regulator circuit. The output terminal of filter 52 is connected to DCV terminal 44. When power supply circuit 42 is a switching circuit, an output voltage feedback signal may be conducted from the output terminal of filter 52 to a switching circuit driving a primary winding of transformer 48 as indicated in FIG. 2.

Power supply circuit 42 is housed within an electrically conductive (e.g., metal) enclosure or chassis 58. Chassis 58 is typically connected to an earth ground electrical potential for safety reasons as indicated by symbol 60. Chassis 58 preferably completely surrounds power supply circuit 42, thus preventing a user from contacting electrical voltages present within power supply circuit 42 during operation. Electrical conductors (e.g., wires) connecting the output terminal of filter 52 to DCV terminal 44, and the common ground electrical potential to return terminal 46, extend through openings in chassis 58 as shown in FIG. 2. Where power supply circuit 42 is a switching circuit, earth grounded chassis 58 also provides a measure of shielding which reduces an amount of electromagnetic radiation produced by the switching circuit during operation and received by other electronic circuits located near power supply 40.

As will be described in detail below, power supply 40 allows a user to electrically couple the common ground electrical potential of power supply circuit 42 to earth grounded chassis 58, or to electrically isolate the common ground electrical potential of power supply circuit 42 from earth grounded chassis 58, without having to open chassis 58. In FIG. 2, optional conductor 62 represents an optional electrical connection made by the user between the common ground electrical potential of power supply circuit 42 and earth grounded chassis 58.

Figure 3:
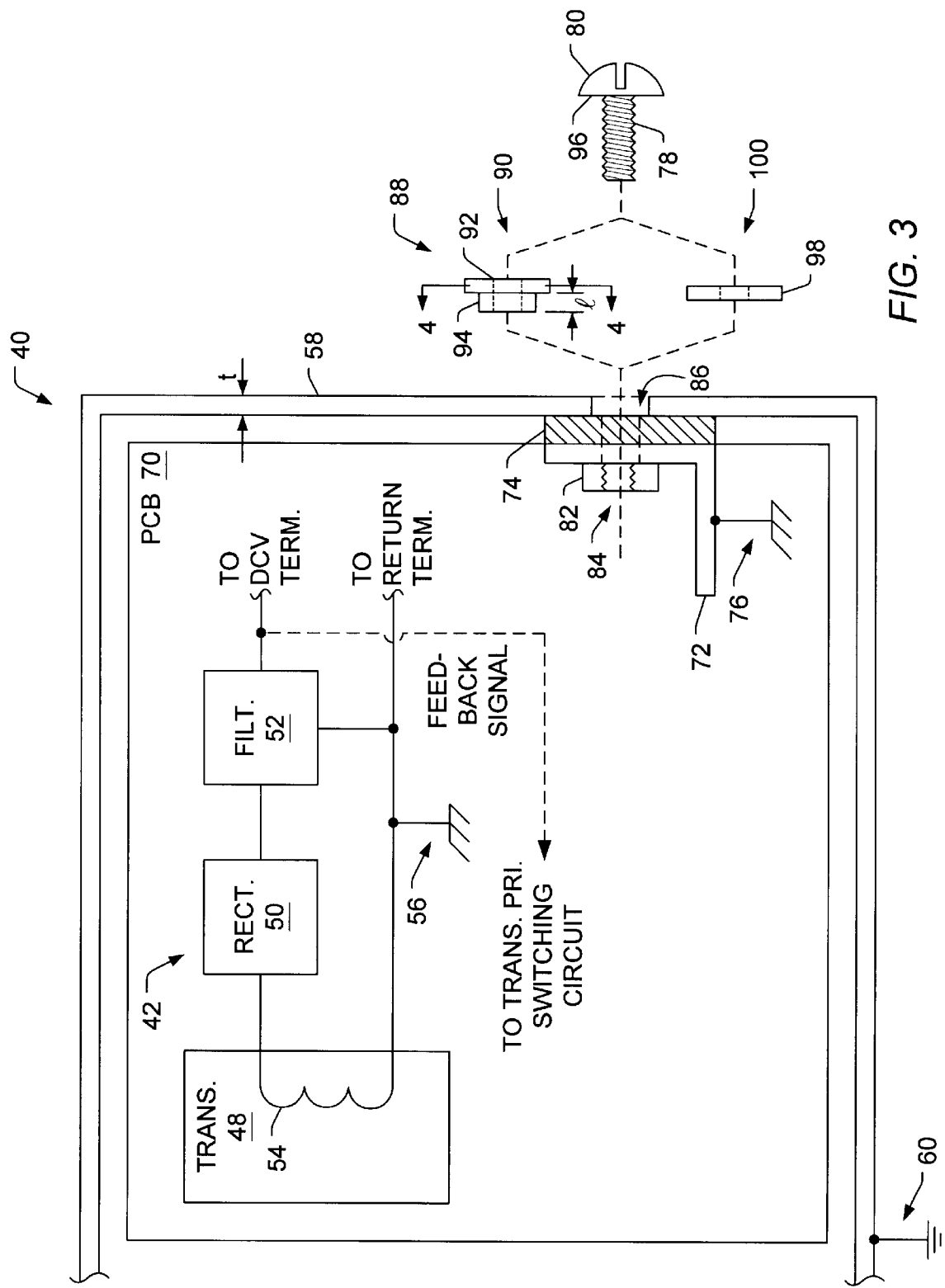
FIG. 3 is a top plan view of the power supply of FIG. 2 wherein the power supply circuit is formed upon a printed circuit board (PCB), and wherein the power supply includes components which allow a user to electrically couple a common ground electrical potential of the power supply circuit to the earth grounded chassis, or to electrically isolate the common ground electrical potential from the earth grounded chassis, without having to open the chassis, and wherein the components include an electrically insulating bushing and a bolt.

FIG. 3 is a top plan view of power supply 40 of FIG. 2 wherein power supply circuit 42 is formed by interconnecting components of power supply circuit 42 using conductive traces of a printed circuit board (PCB) 70. Components of power supply 40 shown in FIG. 2 and described above are labeled similarly in FIG. 3. Power supply 40 also includes an "V" bracket 72 positioned near an outside edge of PCB 70. "L" bracket 72 is formed from an electrically conductive material (e.g., a metal), and includes two vertical planar members intersecting at edges to form an "L." A first of the two vertical planar members of "L" bracket 72 is positioned along the outside edge of PCB 70 and substantially parallel to a vertical side member of chassis 58. The second vertical planar member of "L" bracket 72 serves to support and maintain the vertical orientation of the first vertical planar member. "L" bracket 72 is coupled to the common ground electrical potential of power supply circuit 42 as indicted by symbol 76 in FIG. 3.

An electrically insulating member 74 is interposed between "L" bracket 72 and an adjacent portion of the vertical side member of earth grounded chassis 58. Insulating member 74 has two opposed surfaces. A first of the two opposed surfaces is in physical contact with the first member of "L" bracket 72, and the second surface is in physical contact with the adjacent portion of the vertical side member of chassis 58. Insulating member 74 serves to electrically insulate, and electrically isolate, "L" bracket 72 from chassis 58.

Insulating member 74 is preferably made from an electrically insulating plastic material. Insulating member 74 may also be made from another electrically insulating material such as wood or paper. In order to prevent damage to insulating member 74 in case a high voltage is accidentally or inadvertently applied between "L" bracket 72 and chassis 58, insulating member 74 preferably has a dielectric strength sufficient to withstand an electrical potential of about 3,750 volts applied between "L" bracket 72 and chassis 58 for a time period of approximately 60 seconds. Further, in order to prevent damage to insulating member 74 due to heat produced by power supply circuit 42 during operation, insulating member 74 is preferably made from a material which can withstand a temperature of 100° C. over a significant portion of an expected lifetime of the material.

In the embodiment of FIGS. 2 and 3, the first member of "L" bracket 72 has a hole dimensioned to allow a threaded shaft 78 of a bolt 80 to pass therethrough. A nut 82 is mechanically and electrically coupled (e.g., spot welded) to a side of first member of "L" bracket 72 opposite insulating member 74. Nut 82 has a hole 84 therethrough and a threaded inner surface surrounding the hole (e.g., a threaded hole) for engaging the threaded shaft 78 of bolt 80. The threaded hole 84 of nut 82 is aligned with the hole in the first member of "L" bracket 72. The side member of chassis 58 has a hole 86 dimensioned to allow the threaded shaft 78 of bolt 80 to pass therethrough. Insulating member 74 also has a hole dimensioned to allow the threaded shaft 78 of bolt 80 to pass therethrough. Hole 86 in the side member of chassis 58 and the hole in insulating member 74 are aligned with the hole in the first member of "L" bracket 72. As will be described in more detail below, threaded shaft 78 of bolt 80 is inserted through the holes in the side member of chassis 58, insulating member 74, and the first member of "L" bracket 72, and is received by threaded hole 84 of nut 82. For reasons which will become apparent below, bolt 80 and nut 82 are formed from an electrically conductive material (e.g., a metal).

An electrically insulating bushing 88 is made from an electrically insulating material, and allows the user to electrically isolate the common ground electrical potential of power supply circuit 42 from earth grounded chassis 58. Insulating bushing 88 has a hole 90 dimensioned to allow threaded shaft 78 of bolt 80 to pass therethrough. Insulating busing 88 includes a washer-like first portion 92 and a sleeve-like second portion 94. Hole 90 passes through washer-like first portion 92 and sleeve-like second portion 94.

Figure 4:
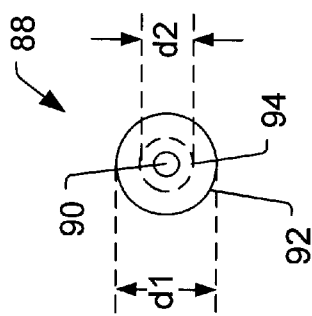
FIG. 4 is a cross-sectional view of the insulating bushing of FIG. 3.

FIG. 4 is a cross-sectional view of insulating bushing 88 as indicated in FIG. 3. As evident in FIG. 4, washer-like first portion 92 and a sleeve-like second portion 94 have substantially round cross sections. Washer-like first portion 92 has an outer diameter d1 which is larger than an outer diameter d2 of sleeve-like second portion 94. Hole 86 in the side member of chassis 58 is dimensioned large enough to receive sleeve-like second portion 94, but too small to receive washer-like first portion 92.

In order to electrically isolate the common ground electrical potential of power supply circuit 42 from the earth grounded chassis 58, the user inserts sleeve-like second portion 94 of insulating bushing 88 into hole 86 in the side member of chassis 58. The user pushes threaded shaft 78 of bolt 80 through hole 90 in insulating bushing 88 and turns bolt 80 to tighten bolt 80. When adequately tightened, bolt 80 holds insulating bushing 88 in place.

As indicated in FIG. 3, sleeve-like second portion 94 of insulating bushing 88 has a length l, and the side member of chassis 58 has a thickness t. Length l of sleeve-like second portion 94 is preferably substantially equal to thickness t of the side member of chassis 58 such that when insulating bushing 88 is held in place by bolt 80, a surface of sleeve-like second portion 94 opposite washer-like first portion 92 contacts insulating member 74, and washer-like first portion 92 is sandwiched between a shoulder portion 96 of bolt 80 and an outer surface of the side member of chassis 58. Outer diameter d1 of washer-like first portion 92 (FIG. 4) is preferably greater than or equal to an outer diameter of shoulder portion 96 of bolt 80 (FIG. 3).

Insulating bushing 88 is preferably made from an electrically insulating plastic material. When installed as described above, and in order to prevent damage to insulating bushing 88 in case a high voltage is accidentally or inadvertently applied between "L" bracket 72 and chassis 58, insulating bushing 88 preferably has a dielectric strength sufficient to withstand an electrical potential of about 3,750 volts applied between "L" bracket 72 and chassis 58 for a time period of approximately 60 seconds. Further, in order to prevent damage to insulating bushing 88 due to heat produced by power supply circuit 42 during operation, insulating bushing 88 is preferably made from a material which can withstand a temperature of 100° C. over a significant portion of an expected lifetime of the material.

An electrically conductive washer 98 is made from an electrically conductive material (e.g., a metal), and allows the user to electrically couple the common ground electrical potential of power supply circuit 42 to earth grounded chassis 58. Conductive washer 98 has a hole 100 dimensioned to allow threaded shaft 78 of bolt 80 to pass therethrough.

In order to electrically couple the common ground electrical potential of power supply circuit 42 to the earth grounded chassis 58, the user aligns hole 100 in conductive washer 98 with hole 86 in the side member of chassis 58, pushes threaded shaft 78 of bolt 80 through hole 100, and turns bolt 80 to tighten bolt 80. When adequately tightened, bolt 80 holds conductive washer 98 in place between shoulder portion 96 of bolt 80 and the outer surface of the side member of chassis 58. Bolt 80 and conductive washer 98 form a conductive electrical path between "L" bracket 72, connected to the common ground electrical potential of power supply circuit 42, and earth grounded chassis 58.

Figure 5:
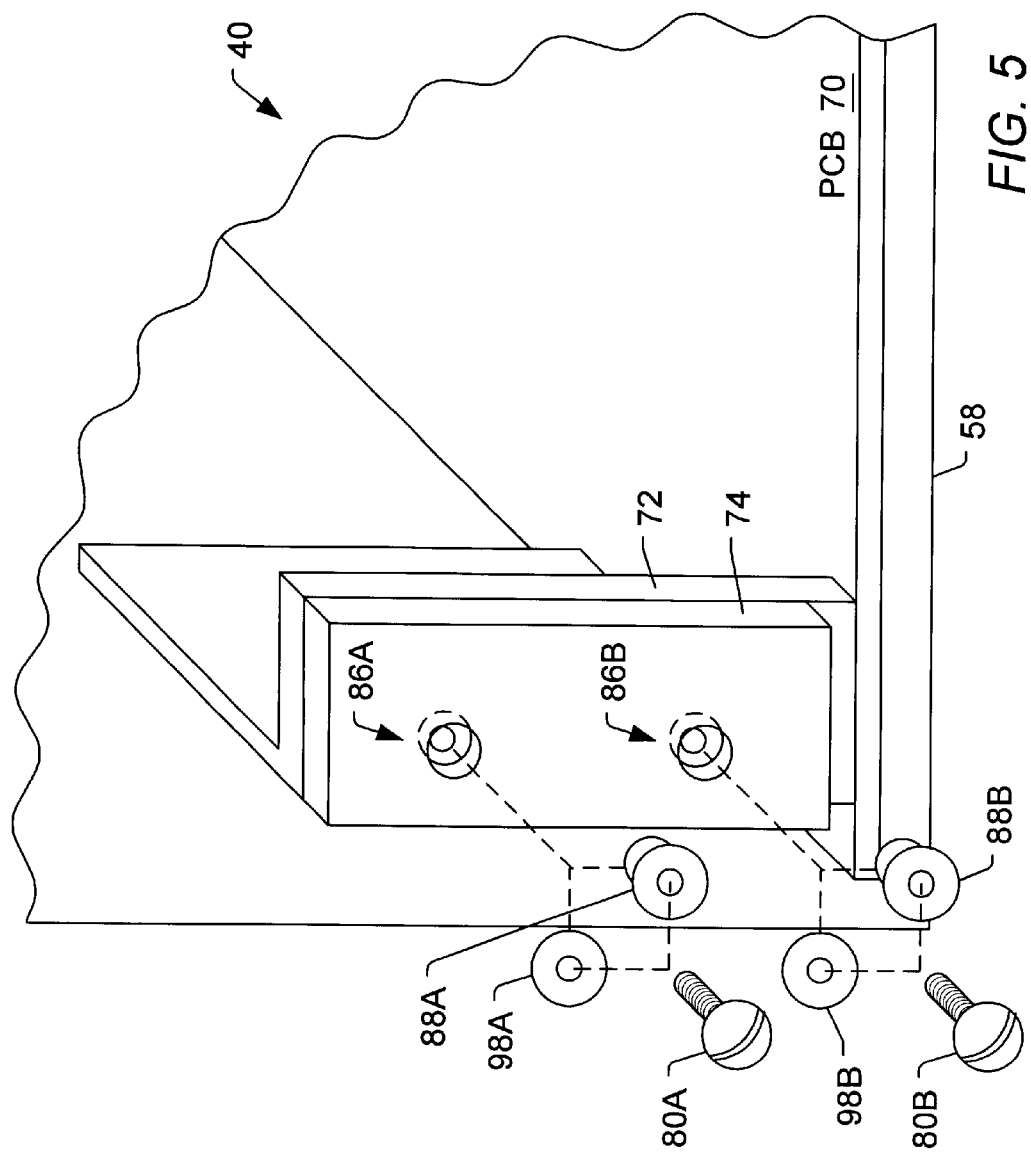
FIG. 5 is a perspective view of an embodiment of the power supply of FIGS. 2 and 3 wherein the power supply includes two bolts providing for redundant coupling of the common ground electrical potential to the earth grounded chassis.

FIG. 5 is a perspective view of an embodiment of power supply 40 of FIGS. 2 and 3 wherein power supply 40 includes two bolts 80A–80B providing for redundant coupling of the common ground electrical potential of power supply circuit 42 to the earth grounded chassis 58. Components of power supply 40 shown in FIGS. 2 and 3 and described above are labeled similarly in FIG. 5. In the embodiment of FIG. 5, the user inserts the sleeve-like second portions of insulating bushings 88A and 88B into respective holes 86A and 86B in the side member of chassis 58 in order to electrically isolate the common ground electrical potential of power supply circuit 42 from the earth grounded chassis 58. The user employs bolts 80A and 80B to hold respective insulating bushings 88A and 88B in place as described above.

In order to electrically couple the common ground electrical potential of power supply circuit 42 to the earth grounded chassis 58, the user aligns the holes in conductive washers 98A and 98B with respective hole 86A and 86B in the side member of chassis 58, pushes the threaded shafts of bolts 80A and 80B through the respective holes, and turns bolts 80A and 80B to tighten respective bolts 80A and 80B. When adequately tightened, bolts 80A and 80B hold respective conductive washers 98A and 98B in place between the shoulder portions of bolts 80A and 80B and the outer surface of the side member of chassis 58. Bolts 80A and 80B and corresponding conductive washers 98A and 98B form two different conductive electrical paths between "L" bracket 72, connected to the common ground electrical potential of power supply circuit 42, and earth grounded chassis 58.

It is noted that the above described components which allow a user to electrically couple a power supply return to a chassis ground, or to electrically isolate the power supply return from the chassis ground, may be advantageously employed in systems having multiple cabinets (or complex cabinet systems) to allow a user to achieve a single point of grounding, if necessary. Further, the above described features may also be employed to selectively isolate or couple a power supply return to a chassis ground in devices other than power supplies.

Numerous variations and modifications will become apparent to those skilled in the art once the above disclosure is fully appreciated. It is intended that the following claims be interpreted to embrace all such variations and modifications.

What is claimed is:

1. A system, comprising:
    a circuit formed upon a printed circuit board (PCB) and having a common ground electrical potential;
    an electrically conductive fastener having a threaded shaft;
    an electrically conductive bracket mounted upon the PCB and electrically coupled to the common ground electrical potential, wherein the bracket receives the threaded shaft of the fastener;
    an electrically insulating bushing having a hole therethrough and comprising a washer-like first portion and a sleeve-like second portion, wherein the hole passes through the first and second portions and is dimensioned to pass the threaded shaft of the fastener, and wherein an outer diameter of the first portion is greater than an outer diameter of the second portion;
    an electrically conductive chassis housing the PCB, wherein the chassis is coupled to an earth ground potential, and wherein a portion of the chassis is adjacent to the bracket and has a hole extending therethrough, and wherein the hole is dimensioned to receive the second portion of the insulating bushing.

2. The system as recited in claim 1, wherein the electrically insulating bushing is formed from an electrically insulating plastic material.

3. The system as recited in claim 1, wherein the hole in the portion of the chassis adjacent to the bracket has a diameter greater than or equal to the outer diameter of the second portion of the insulating bushing and less than the outer diameter of the first portion of the insulating bushing.

4. The system as recited in claim 3, wherein the fastener is a bolt, and wherein the bracket has a hole extending therethrough, and wherein the hole is dimensioned to pass the threaded shaft of the bolt, and wherein the bracket has an electrically conductive nut mechanically and electrically coupled thereto, wherein the nut has a hole therethrough and a threaded inner surface for receiving the threaded shaft of the bolt.

5. The system as recited in claim 4, further comprising an electrically insulating member disposed between, and in physical contact with, the bracket and the portion of the chassis adjacent to the bracket, and wherein the insulating member has a hole extending therethrough, and wherein the hole is dimensioned to pass the threaded shaft of the bolt.

6. The system as recited in claim 4, wherein the electrically insulating member is formed from an electrically insulating plastic material.

7. The system as recited in claim 4, wherein the electrically insulating member has a dielectric strength sufficient to withstand an electrical potential of about 3,750 volts applied between the bracket and the chassis for a time period of approximately 60 seconds.

8. The system as recited in claim 4, wherein the insulating member is made from a material which can withstand a temperature of 100° C. over a significant portion of an expected lifetime of the material.

9. The system as recited in claim 4, wherein when the second portion of the insulating bushing resides within the hole in the chassis, and the threaded shaft of the bolt passes through the holes in the insulating bushing and the insulating member and engages the threaded inner surface of the nut, the bracket is electrically isolated from the chassis.

10. The system as recited in claim 4, further comprising an electrically conductive washer having a hole extending therethrough, wherein the hole is dimensioned to pass the threaded shaft of the bolt.

11. The system as recited in claim 10, wherein when the threaded shaft of the bolt passes through the holes in the conductive washer, the portion of the chassis adjacent to the bracket, and the insulating member, and sufficiently engages the threaded inner surface of the nut, the bracket is electrically coupled to the chassis through the conductive bolt and the conductive washer.

12. A system, comprising:
- a circuit formed upon a printed circuit board (PCB) and having a common ground electrical potential;
- an electrically conductive bolt having a threaded shaft;
- an electrically conductive bracket mounted upon the PCB and coupled to the common ground electrical potential, wherein the bracket has a hole extending therethrough, wherein the hole contains the threaded shaft of the bolt, and wherein the bracket has an electrically conductive nut mechanically and electrically coupled thereto, wherein the nut has a hole therethrough and a threaded inner surface for receiving the threaded shaft of the bolt;
- an electrically insulating bushing comprising a washer-like first portion and a sleeve-like second portion, wherein the insulating bushing has a hole passing through the first and second portions, and wherein the hole is dimensioned to allow the threaded shaft to pass therethrough, and wherein an outer diameter of the first portion is greater than an outer diameter of the second portion;
- an electrically conductive chassis housing the PCB, wherein the chassis is adapted for coupling to an earth ground potential, and wherein a portion of the chassis is adjacent to the bracket and has a hole extending therethrough, and wherein the hole has a diameter greater than or equal to the outer diameter of the second portion of the insulating bushing and less than the outer diameter of the first portion of the insulating bushing; and
- an electrically insulating member disposed between, and in physical contact with, the bracket and the portion of the chassis adjacent to the bracket, wherein the insulating member has a hole extending therethrough, and wherein the hole is dimensioned to pass the threaded shaft of the bolt.

13. The system as recited in claim 12, wherein the electrically insulating bushing is formed from an electrically insulating plastic material.

14. The system as recited in claim 12, wherein the electrically insulating member is formed from an electrically insulating plastic material.

15. The system as recited in claim 12, wherein the electrically insulating member has a dielectric strength sufficient to withstand an electrical potential of about 3,750 volts applied between the bracket and the chassis for a time period of approximately 60 seconds.

16. The system as recited in claim 12, wherein the insulating member is made from a material which can withstand a temperature of 100° C. over a significant portion of an expected lifetime of the material.

17. The system as recited in claim 12, wherein when the second portion of the insulating bushing resides within the hole in the chassis, and the threaded shaft of the bolt passes through the holes in the insulating bushing and the insulating member and engages the threaded inner surface of the nut, the bracket is electrically isolated from the chassis.

18. The system as recited in claim 12, further comprising an electrically conductive washer having a hole extending therethrough, wherein the hole is dimensioned to pass the threaded shaft of the bolt.

19. The system as recited in claim 18, wherein when the threaded shaft of the bolt passes through the holes in the conductive washer, the portion of the chassis adjacent to the bracket, and the insulating member, and sufficiently engages the threaded inner surface of the nut, the bracket is electrically coupled to the chassis through the conductive bolt and the conductive washer.

* * * * *